US008195452B2

(12) United States Patent
Tabus et al.

(10) Patent No.: US 8,195,452 B2
(45) Date of Patent: Jun. 5, 2012

(54) HIGH-QUALITY ENCODING AT LOW-BIT RATES

(75) Inventors: Ioan Tabus, Tampere (FI); Adriana Vasilache, Tampere (FI)

(73) Assignee: Nokia Corporation, Espoo (FI)

( * ) Notice: Subject to any disclaimer, the term of this patent is extended or adjusted under 35 U.S.C. 154(b) by 941 days.

(21) Appl. No.: 12/138,084

(22) Filed: Jun. 12, 2008

(65) Prior Publication Data

US 2009/0313027 A1 Dec. 17, 2009

(51) Int. Cl.
*G10L 19/10* (2006.01)
*G10L 19/00* (2006.01)

(52) U.S. Cl. ........ 704/221; 704/222; 704/230; 704/500; 704/501

(58) Field of Classification Search .................. None
See application file for complete search history.

(56) References Cited

U.S. PATENT DOCUMENTS

| | | | | |
|---|---|---|---|---|
| 4,791,654 | A * | 12/1988 | De Marca et al. | 375/241 |
| 5,870,405 | A | 2/1999 | Hardwick et al. | |
| 6,131,084 | A | 10/2000 | Hardwick | |
| 6,260,017 | B1 * | 7/2001 | Das et al. | 704/265 |
| 6,714,907 | B2 * | 3/2004 | Gao | 704/220 |
| 6,836,225 | B2 * | 12/2004 | Lee et al. | 341/50 |

FOREIGN PATENT DOCUMENTS

| EP | 0577488 | 1/1994 |
|---|---|---|
| WO | 2008049737 | 5/2008 |

OTHER PUBLICATIONS

Kazunori Ozawa, Toshiyuki Nomura, Masahiro Serizawa, "MP-CELP speech coding based on multipulse vector quantization and fast search," Electronics and Communications in Japan (Part III: Fundamental Electronic Science), vol. 80, Issue 11, pp. 55-63, Nov. 1997.*
Ben-Neticha, Z.; Mabilleau, P.; Adoul, J.-P.; "The 'stretched'-Golay and other codes for high-SNR finite-delay quantization of the Gaussian source at ½ bit per sample," Communications, IEEE Transactions on, Dec. 1990, vol. 38 Issue:12 On pp. 2089-2093.*
Adoul, J -P.; Lamblin, C.; "A comparison of some algebraic structures for CELP coding of speech," Acoustics, Speech, and Signal Processing, IEEE International Conference on ICASSP'87, Apr. 1987, On pp. 1953-1956.*
Ragot, S. ; Adoul, J.-P. ; Lefebvre, R.; "Hexacode-based quantization of the Gaussian source at ½ bit per sample," Communications, IEEE Transactions on, Dec. 2001, vol. 49 , Issue:12, On pp. 2056-2058.*

(Continued)

*Primary Examiner* — Matthew Sked
(74) *Attorney, Agent, or Firm* — Banner & Witcoff, Ltd

(57) ABSTRACT

Methods and devices provide improved perceived quality of an audio (or other) coded signal at a low bit-rate. An input signal may be split into an outlier portion and a stationary portion. The outlier portion of the input signal may be encoded. The stationary portion may be divided into subvectors. Each subvector may be classified as trivial or non-trivial. Each trivial subvector may be encoded using a pre-defined pattern. Each non-trivial subvector may be encoded with at least one location of at least one significant sample and a sign of the significant sample.

19 Claims, 4 Drawing Sheets

OTHER PUBLICATIONS

Ragot, S.; Bessette, B.; Lefebvre, R.;Low-complexity multi-rate lattice vector quantization with application to wideband TCX speech coding at 32 kbit/s Acoustics, Speech, and Signal Processing, 2004. Proceedings. (ICASSP '04). IEEE International Conference on, vol. 1, May 17-24, 2004 pp. 1-501-4 vol. 1.

S. Ragot, J.-P. Adoul, and Roch Lefebvre, Hexacode-based quantization of the Gaussian source at ½ bit per sample, IEEE Transactions on Communications, vol. 49, No. 12, pp. 2056-2058, 2001.

A. Vardy and Y. Be'ery, More efficient soft decoding of the Golay codes, IEEE Transactions on Information Theory, vol. 37, Issue 3, May 1991 pp. 667-672.

PCT International Search Report and Written Opinion in International Application No. PCT/FI2009/050404, dated Sep. 17, 2009.

G. Poggi et al., "Codebook Ordering Techniques for Address-Predictive VQ", Acoustics, Speech, and Signal Processing, ICASSP-93., vol. 5, Apr. 27-30, 1993, pp. 586-589.

G. Poggi, "Fast Algorithm for Full-Search VQ Encoding", Electronics Letters, vol. 29, Issue 12, Jun. 10, 1993 pp. 1141-1142.

M. Kohata et al., "Vector Quantization With Hyper-Columnar Clusters," Proc. IEEE Int. Conf. on Acoustics, Speech, and Signal Processing (ICASSP'94), Apr. 19-22, 1994, vol. 1, pp. 1-489-I-492.

R. M. Gray, "Vector Quantization," IEEE ASSP Magazine, Apr. 1984, pp. 4-29.

EPO Search Report and Written Opinion in International Application No. PCT/FI2009/050603, mailed Nov. 17, 2009.

Notification of First Office Action dated Apr. 6, 2012 in Chinese Application No. 200980134689.4 and English translation thereof.

"Fast nearest-neighbor search algorithms based on approximation-elimination search", V. Ramasubramanian eta!, Pattern Recognition, vol. 33, No. 9, pp. 1497-1510, Sep. 30, 2000.

"Fast Search for Entropy-Constrained VQ", Jean Cardinal, Proceedings of International Conference on hnage Analysis and Processing, 1999, pp. 1-5, Sep. 29, 1999.

* cited by examiner

HIGH-QUALITY ENCODING AT LOW-BIT RATES

TECHNICAL FIELD

Aspects of the invention relate generally to encoding and decoding of signals. More specifically, aspects of the invention relate to low bit-rate encoding, especially in the context of data encoding used in a communication network of for data storage applications.

BACKGROUND

It is preferable to be able to use low bit-rate audio encoding in order to efficiently utilize and maximize usage of network transmission capacity in communication systems or storage capacity in storage systems. However, it is also preferable to encode audio such that the perceived quality of the audio to a listener is improved.

Currently, the perceived quality of audio encoded at low bit-rates may be less than desirable for some applications. The perceived degradation of audio quality can be more pronounced in the lower end of the audio frequency range (around 0-7 kHz). This can be especially true when processing complex input signals, such as music.

Hence, there is a need for devices and methods to provide high-quality audio encoding at low-bit rates. By extension, there is also a need for improved coding of any data that may not require perfect reconstruction such as, for example, in context of image or video encoding.

SUMMARY

In accordance with various embodiments of the present invention, methods and devices can provide improved perceived quality of an audio (or other) coded signal at a low bit-rate. In an embodiment, an input signal can be split into an outlier portion and a stationary portion. The outlier portion of the input signal can be encoded. The stationary portion can be divided into subvectors. Each subvector can be classified as trivial or non-trivial. Each trivial subvector can be encoded using a pre-defined pattern. Each non-trivial subvector can be encoded by specifying the gain for all sub-vectors, and at least one location of at least one significant sample and a sign of the significant sample.

In one embodiment, a method includes the steps of splitting an input signal into an outlier portion and a stationary portion; encoding the outlier portion of the input signal; dividing the stationary portion into subvectors; classifying each of said subvectors as trivial or non-trivial; encoding each said trivial subvector using a pre-defined pattern; and encoding each said non-trivial subvector with at least one location of a significant sample and a sign of the significant sample.

In another embodiment, a method includes the steps of splitting an input signal into an outlier portion and a stationary portion; encoding amplitudes, signs, and positions of the outlier portion of the input signal; dividing the stationary portion into subvectors of equal length; classifying each of said subvectors as trivial or non-trivial; encoding each said trivial subvector using a pre-defined pattern; and encoding each said non-trivial subvector with at least one location of a significant sample and a sign of the significant sample.

In still another embodiment, a method includes the steps of splitting an input signal into an outlier portion and a stationary portion; encoding amplitudes, signs, and positions of the outlier portion of the input signal; dividing the stationary portion into subvectors of equal length; classifying each of said subvectors as trivial or non-trivial; encoding each said trivial subvector using a pre-defined pattern; and encoding each said non-trivial subvector with at least one location of a significant sample and a sign of the significant sample, said location of the significant sample within the non-trivial subvector is encoded using a nearest neighbor in a selected portion of binary code.

In a further embodiment, a method includes the steps of splitting an input signal into an outlier portion and a stationary portion; encoding amplitudes using Golomb-Rice codes of the outlier portion of the input signal; encoding signs and positions of the outlier portion of the input signal; dividing the stationary portion into subvectors of equal length; classifying each of said subvectors as trivial or non-trivial; encoding each said trivial subvector using a pre-defined pattern; and encoding each said non-trivial subvector with at least one location of a significant sample and a sign of the significant sample, said location of the significant sample within the non-trivial subvector is encoded using a nearest neighbor in a selected portion of binary code.

In still a further embodiment, a method includes the steps of splitting an input signal into an outlier portion and a stationary portion; encoding amplitudes using Golomb-Rice codes of the input signal; encoding signs and positions of the outlier portion of the input signal; dividing the stationary portion into subvectors of equal length; classifying each of said subvectors as trivial or non-trivial; encoding each said trivial subvector using a pre-defined pattern; and encoding each said non-trivial subvector with at least one location of a significant sample and a sign of the significant sample, said location of the significant sample within the non-trivial subvector is encoded using a nearest neighbor in a selected portion of binary code. Each non-trivial subvector can be encoded by specifying the gain for all sub-vectors, and at least one location of a significant sample and a sign of the significant sample.

In yet another embodiment, a method includes the steps of determining whether at least one outlier is present; decoding said at least one outlier (position, sign and amplitude); processing information about one or more subvectors such as, for example, processing at least one subvector mask; processing at least one subvector in order to identify outlier information selected from the group consisting of: position, magnitude, and sign; and using the outlier information in order to perform reconstruction.

In another embodiment, out of the long vector, the outliers (several components) may be detected and encoded, and the remaining vector may be divided in subvectors and may be encoded sub-vector by sub-vector.

In still another embodiment, a generic method of encoding of long data vectors at low bit-rates can be utilized. According to this embodiment, due to a typical non-stationary data distribution of long vectors, a piecewise stationary plus contamination model may be used. The generic solution may encode part of the data using Golomb-Rice (GR) codes, divide remaining part of the data into subvectors, and for each subvector to encode the vector of absolute values using the nearest neighbor in a certain shell of the binary $\{0; 1\}$ code and transmit the sign information separately.

In a further embodiment, a method includes the steps of identifying a Golay codeword; identifying a Hamming weight for said Golay codeword; and identifying a maximum dot product in relation with an input vector for each said Hamming weight. One of the Golay codewords identified as maximizing the dot product in relation with an input subvector, for each Hamming weight value, may encode, through its index, the position of the significant components of the subvector. The signs of the significant components may also be encoded.

In another embodiment, a method includes the steps of identifying a plurality of interpretations for each hexacode codeword; identifying a Hamming weight for each said interpretation of the hexacode codeword; and identifying a maximum dot product in relation with an input vector for each said Hamming weight.

In yet another embodiment, a method includes encoding a vector with at least one location of a significant sample and a sign of the significant sample, said location of the significant sample within the vector may be encoded using a nearest neighbor in a selected portion of binary code.

In the foregoing embodiments, coding of the stationary part of an input may be coded with binary codes including, but not limited to, Golay codes.

The foregoing embodiments can be implemented as computer-executable instructions stored on a computer-readable medium.

In addition, the foregoing embodiments can be implemented in an apparatus that includes a processor for executing computer executable instructions, memory that stores the computer executable instructions, and an input means for receiving an input signal. Each of the above-identified method steps can be implemented as computer-executable instructions that are stored in the memory and executed by the processor.

Additional features and advantages of the invention will be apparent upon reviewing the following detailed description.

BRIEF DESCRIPTION OF THE DRAWINGS

A more complete understanding of the present invention and the advantages thereof may be acquired by referring to the following description in consideration of the accompanying drawings, in which like reference numbers indicate like features, and wherein.

DETAILED DESCRIPTION

In the following description of the various embodiments, reference is made to the accompanying drawings, which form a part hereof, and in which is shown by way of illustration various embodiments in which the invention may be practiced. It is to be understood that other embodiments may be utilized and structural and functional modifications may be made without departing from the scope and spirit of the present invention.

It is noted that various connections are set forth between elements in the following description. It is noted that these connections in general and, unless specified otherwise, may be direct or indirect and that this specification is not intended to be limiting in this respect.

Figure 1:
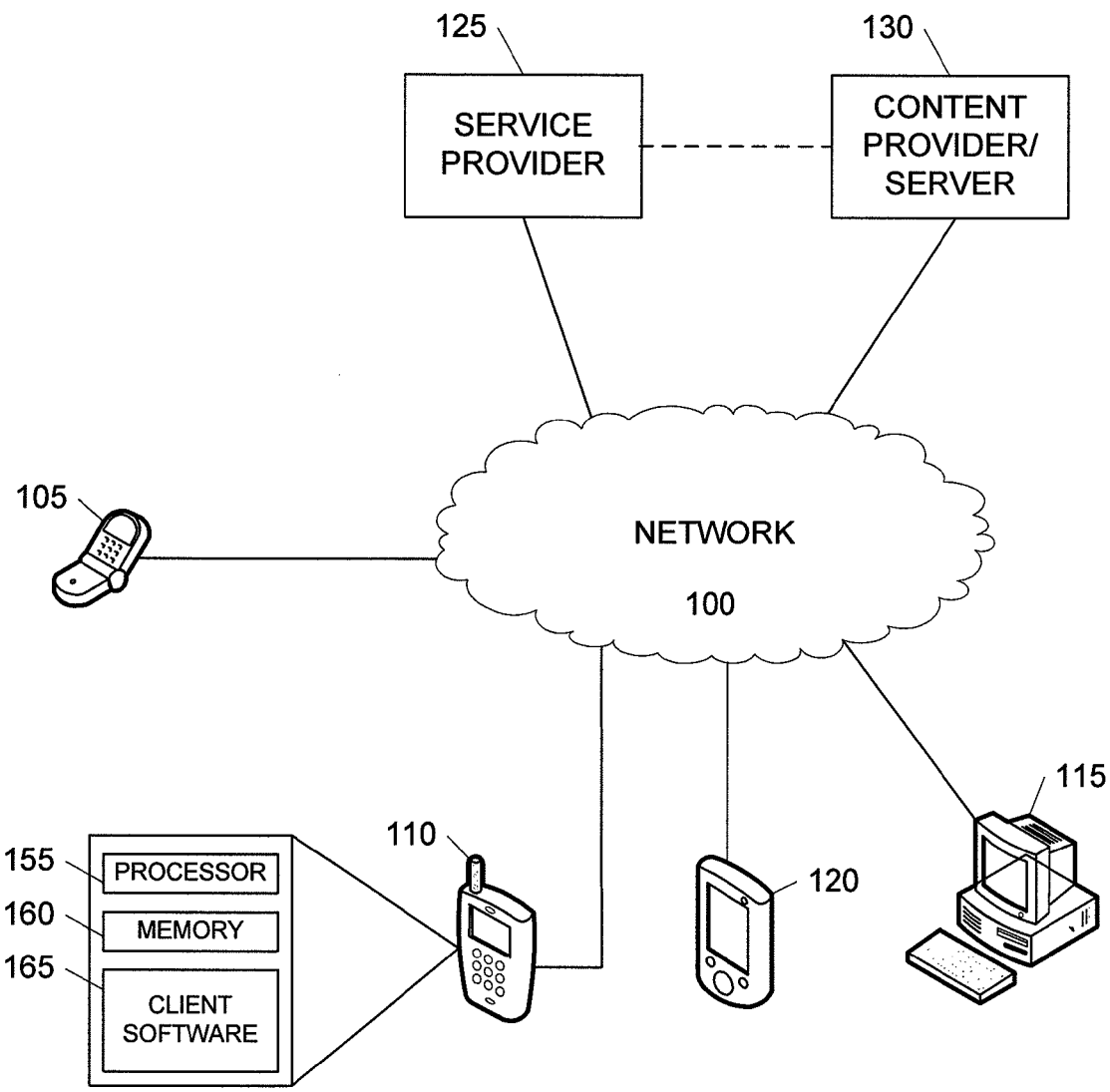
FIG. 1 illustrates an example of a communication system in which one or more illustrative embodiments of the invention may be implemented.

FIG. 1 illustrates an example communication network through which various inventive principles may be practiced. A number of computers and devices including mobile communication devices 105 and 110, personal digital assistant (PDA) 120, personal computer (PC) 115, service provider 125 and content provider 130 may communicate with one another and with other devices through network 100. Network 100 may include wired and wireless connections and network elements, and connections over the network may include permanent or temporary connections. Communication through network 100 is not limited to the illustrated devices and may include additional devices such as a home video storage system, a portable audio/video player, a digital camera/camcorder, a positioning device such as a GPS (Global Positioning System) device or satellite, a mobile television, a set-top box (STB), a digital video recorder, remote control devices and any combination thereof.

Although shown as a single network in FIG. 1 for simplicity, network 100 may include multiple networks that are interlinked so as to provide internetworked communications. Such networks may include one or more private or public packet-switched networks (e.g., the Internet), one or more private or public circuit-switched networks (e.g., a public switched telephone network), a cellular network configured to facilitate communications to and from mobile communication devices 105 and 110 (e.g., through use of base stations, mobile switching centers, etc.), a short or medium range wireless communication connection (e.g., Bluetooth®, ultra wideband (UWB), infrared, WiBree, wireless local area network (WLAN) according to one or more versions Institute of Electrical and Electronics Engineers standard no. 802.11), or a high-speed wireless data network such as Evolution-Data Optimized (EV-DO) networks, Universal Mobile Telecommunications System (UMTS) networks, Long Term Evolution (LTE) networks or Enhanced Data rates for GSM Evolution (EDGE) networks. Devices 105-120 may use various communication protocols such as Internet Protocol (IP), Transmission Control Protocol (TCP), Simple Mail Transfer Protocol (SMTP) among others known in the art. Various messaging services such as Short Messaging Service (SMS) may also be included.

Devices 105-120 may be configured to interact with each other or other devices, such as content server 130 or service provider 125. In one example, mobile device 110 may include client software 165 that is configured to coordinate the transmission and reception of information to and from content provider/server 130. In one arrangement, client software 165 may comprise a Voice over IP (VoIP) application, employing for example the Real-time Transport Protocol (RTP), the User Datagram Protocol (UDP), and the Internet Protocol (IP). Alternatively, different set of protocols may be used, comprising for example the Secure RTP (SRTP) and/or the Datagram Congestion Control Protocol (DCCP). In another arrangement, client software 165 may include application or server specific protocols for requesting and receiving content from content server 130. For example, client software 165 may comprise a Web browser or mobile variants thereof and content provider/server 130 may comprise a web server. Billing services (not shown) may also be included to charge access or data fees for services rendered. In one arrangement where service provider 125 provides cellular network access (e.g., a wireless service provider), client software 165 may include instructions for access and communication through the cellular network. Client software 165 may be stored in computer-readable memory 160 such as read only or random access memory in device 110 and may include instructions that cause one or more components (e.g., processor 155, a transceiver, and a display) of device 110 to perform various functions and methods including those described herein.

Figure 2:
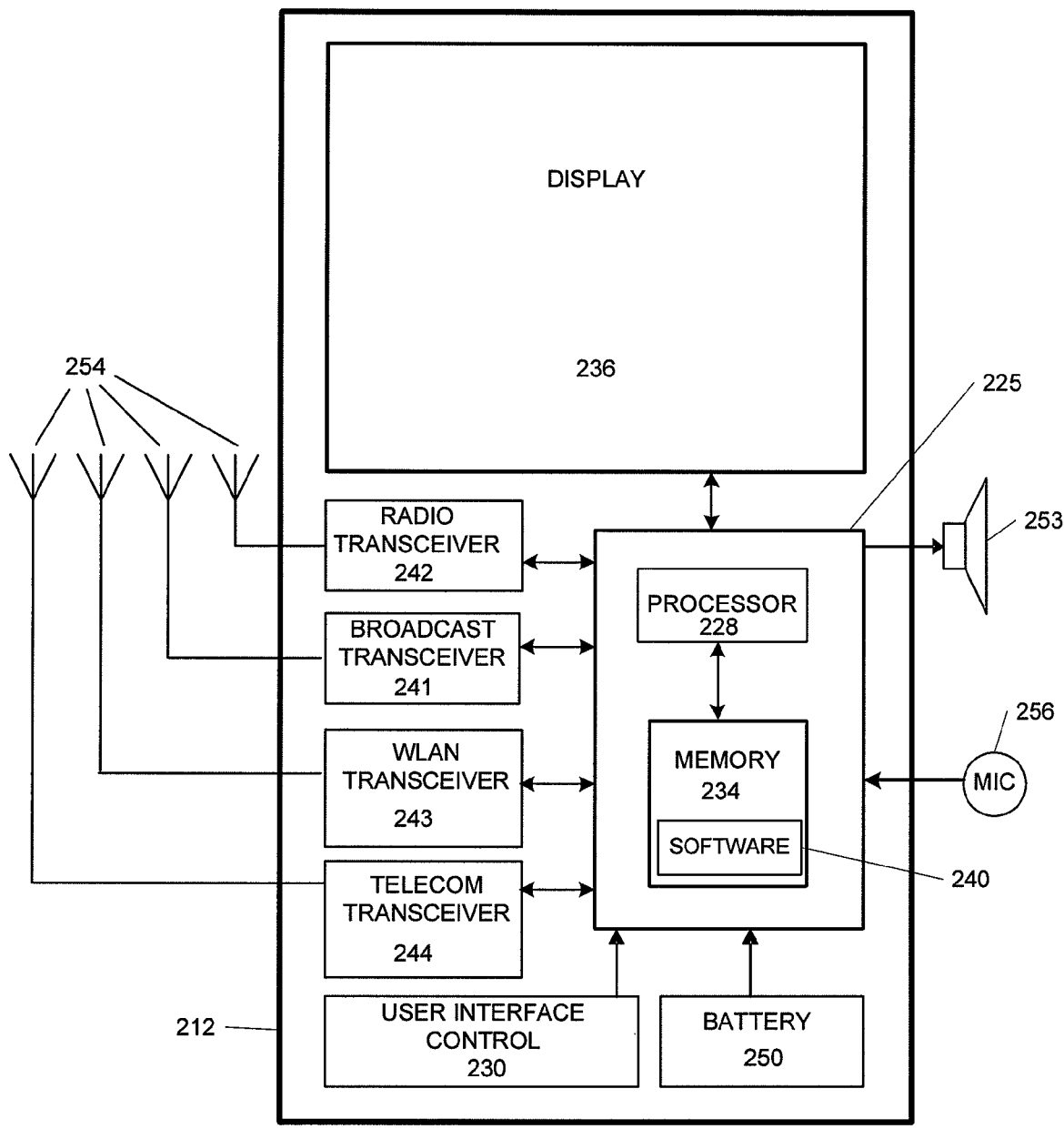
FIG. 2 illustrates an example of a terminal device in accordance with an aspect of the invention.

FIG. 2 illustrates a computing device such as mobile device 212 that may be used in network 100 of FIG. 1. Mobile device 212 may include a controller 225 connected to a user interface control 230, display 236 and other elements as illustrated. Controller 225 may include one or more processors 228 and memory 234 storing software 240. Mobile device 212 may also include a battery 250, speaker 253 and antenna 254. User interface control 230 may include controllers or adapters configured to receive input from or provide output to a keypad, touch screen, voice interface (e.g. via microphone 256), function keys, joystick, data glove, mouse and the like.

Computer executable instructions and data used by processor 228 and other components of mobile device 212 may be stored in a storage facility such as memory 234. Memory 234 may comprise any type or combination of read only memory (ROM) modules or random access memory (RAM) modules, including both volatile and nonvolatile memory such as disks. Software 240 may be stored within memory 234 to provide instructions to processor 228 such that when the instructions are executed, processor 228, mobile device 212 and/or other components of mobile device 212 are caused to perform various functions or methods such as those described herein. Software may include both applications and operating system software, and may include code segments, instructions, applets, pre-compiled code, compiled code, computer programs, program modules, engines, program logic, and combinations thereof. Computer executable instructions and data may further be stored on computer readable media including EEPROM, flash memory or other memory technology, CD-ROM, DVD or other optical disk storage, magnetic cassettes, magnetic tape, magnetic storage and the like.

It should be understood that any of the method steps, procedures or functions described herein may be implemented using one or more processors in combination with executable instructions that cause the processors and other components to perform the method steps, procedures or functions. As used herein, the terms "processor" and "computer" whether used alone or in combination with executable instructions stored in a memory or other computer-readable storage medium should be understood to encompass any of various types of well-known computing structures including but not limited to one or more microprocessors, special-purpose computer chips, field-programmable gate arrays (FPGAS), controllers, application-specific integrated circuits (ASICS), combinations of hardware/firmware, or other special or general-purpose processing circuitry.

Mobile device 212 or its various components may be configured to transmit, encode, receive, decode and process various types of transmissions including digital broadband broadcast transmissions that are based, for example, on the Digital Video Broadcast (DVB) standard, such as DVB-H, DVB-H+, or DVB-MHP, through a specific broadcast transceiver 241. Other digital transmission formats may alternatively be used to deliver content and information of availability of supplemental services. Additionally or alternatively, mobile device 212 may be configured to receive, decode and process transmissions through FM/AM Radio transceiver 242, wireless local area network (WLAN) transceiver 243, and telecommunications transceiver 244. Transceivers 241, 242, 243 and 244 may, alternatively, include individual transmitter and receiver components.

Although the above description of FIG. 2 generally relates to a mobile device, other devices or systems may include the same or similar components and perform the same or similar functions and methods. For example, a stationary computer such as PC 115 (FIG. 1) may include the components described above and may be configured to perform the same or similar functions as mobile device 212 and its components. The embodiments herein include any feature or combination of features disclosed herein either explicitly or any generalization thereof. While the invention has been described with respect to specific examples including presently preferred modes of carrying out the invention, those skilled in the art will appreciate that there are numerous variations and permutations of the above described systems and techniques.

One or more aspects or embodiments of the present invention can be implemented using the example communication system of FIG. 1 and/or the terminal device of FIG. 2 in order to provide good perceived audio quality over a wide variety of input signals at low-bit rates. Similarly, one or more aspects or embodiments of the present invention can be used to provide improved coding of any data that may not require perfect reconstruction such as, for example, in context of image or video encoding.

Golomb-Rice coding is a known data compression scheme based on entropy. Golomb-Rice coding uses a tunable parameter M to divide an input value into two parts: q, the result of a division by M, and r, the remainder. The quotient is sent in unary coding, followed by the remainder in truncated binary encoding.

In one aspect or embodiment of the invention, the data to be encoded can consist of a long vector "z" that has a dimension "N." Because of the desired low-bit rate preferable in order to maximize data transmission, a global gain "g" can be used for the vector, such that $z=g\ z'$. Data in an input signal from any source may have a Gaussian distribution that may be contaminated by outliers.

In another aspect or embodiment, the invention may also use a global gain for both outliers and sub-vectors. In one embodiment a common gain parameter may be used for both outliers and sub-vectors, whereas in other embodiments may employ separate gains for outliers and sub-vectors. During decoding process, the gain parameter contribution may be included during reconstruction.

In various embodiments of the invention, different coding strategies may be used to utilize memory 234 and bandwidth. One such strategy is block based. Another strategy is sparse encoding, which may be used to handle any outlier portions in otherwise Gaussian distribution of an input signal, if such outliers exist. In one example embodiment, in block-based encoding, an input vector is split into subvectors of length "L." Each L-dimensional subvector can be encoded by providing information regarding one or more quantities such as, for example: the significance of the samples with respect to a significance threshold, the sign of the samples, and the amplitude of the samples. In another example embodiment, the subvectors may be of different length. In such an embodiment, the provided information may also comprise the lengths of subvectors. For low distortion and thus high quality, the significance threshold may be as low as reachable under the available bit rate. If very low bit rates are used, most of the bit rate may be used to encode the significance of the samples with respect to the significance threshold and the sign of the samples. If so, this may limit the amount of bit rate available for encoding amplitudes.

In the encoding process, there are opposite ends of the spectrum for bit rate requirements and corresponding quality of the encoded data. For example, on one end of the spectrum, encoding data without losses would produce the highest quality output, but would require a higher bit rate. In contrast, allowing inaccuracies would require less bit rate, but may affect the perceived quality of the output. In order to minimize the bit rate required to code a vector while simultaneously maximizing the quality of the output, a combination of these competing interests may be selected.

If a sign of the sample is used as one of the qualities to encode a subvector, the sign may be encoded in a single bit per sign in a uniform manner. Alternative approaches to encoding of signs includes for example using a codebook of possible sign combinations and providing an index to this codebook to indicate employed signs.

The coding of amplitudes may be expensive at rates less than one bit per significant sample of the input vector. For this reason, it may be preferable to select only a few of the significant samples—i.e. the outliers—to use additional bits for encoding the amplitudes, and these selected samples preferably have certain outlying features. An example of a feature making a sample an outlier is an absolute value of sample amplitude exceeding a pre-defined significance threshold. This threshold may be static or adaptive. Other example solutions may use various different criteria instead of or in addition to using a significance threshold with respect to the amplitude of a sample for classifying a sample as an outlier. Such criteria may include for example ones taking into account the position of a sample in the data vector, position of a sample with respect to other significant samples, etc. Encoding the position and significance of these outliers may preferably be performed without losses.

The lossy code for the significance information may be selected such that it has remarkable geometrical features (e.g., the methodology holding for any general binary code). However, in order to help explain the procedures described herein, the case can be illustrated by $\mathcal{G}_{23}$, the (23-12) perfect binary Golay codes which have the unique property that spheres of radius 3 around the codevectors form a partition of the binary space with 23 dimensions. With such codes we can specify that 0, 7, 8, 11, 12, 15, 16, or 23 out of 23 samples are significant, with a maximum of 3 errors. In this example, an error can mean that a significant sample was declared or classified as an insignificant sample, or vice versa. In other embodiments, the Golay code may be replaced with a different binary code in order to encode the significance information.

In lossy significance encoding, the budget of bits may not be enough to transmit the significance of all vector samples. However, for correlated sources the significant samples are often encountered in bursts. This may make it possible to transmit significance information only for certain portions of the vector.

The memory of the source can also be utilized by setting probabilities for the codevectors of the lossy code according to the probability of the source providing the corresponding input vectors. A universal code may have equal probabilities, unless very specific knowledge of the source statistics is available, or can be inferred from the history (training material) of that source. As referenced herein, equal probabilities are assumed for simplicity. However, a person of skill in the art will understand that in some applications the unequal probabilities can be set easily by a plug in approach, from training data or available signal history.

Figure 3:
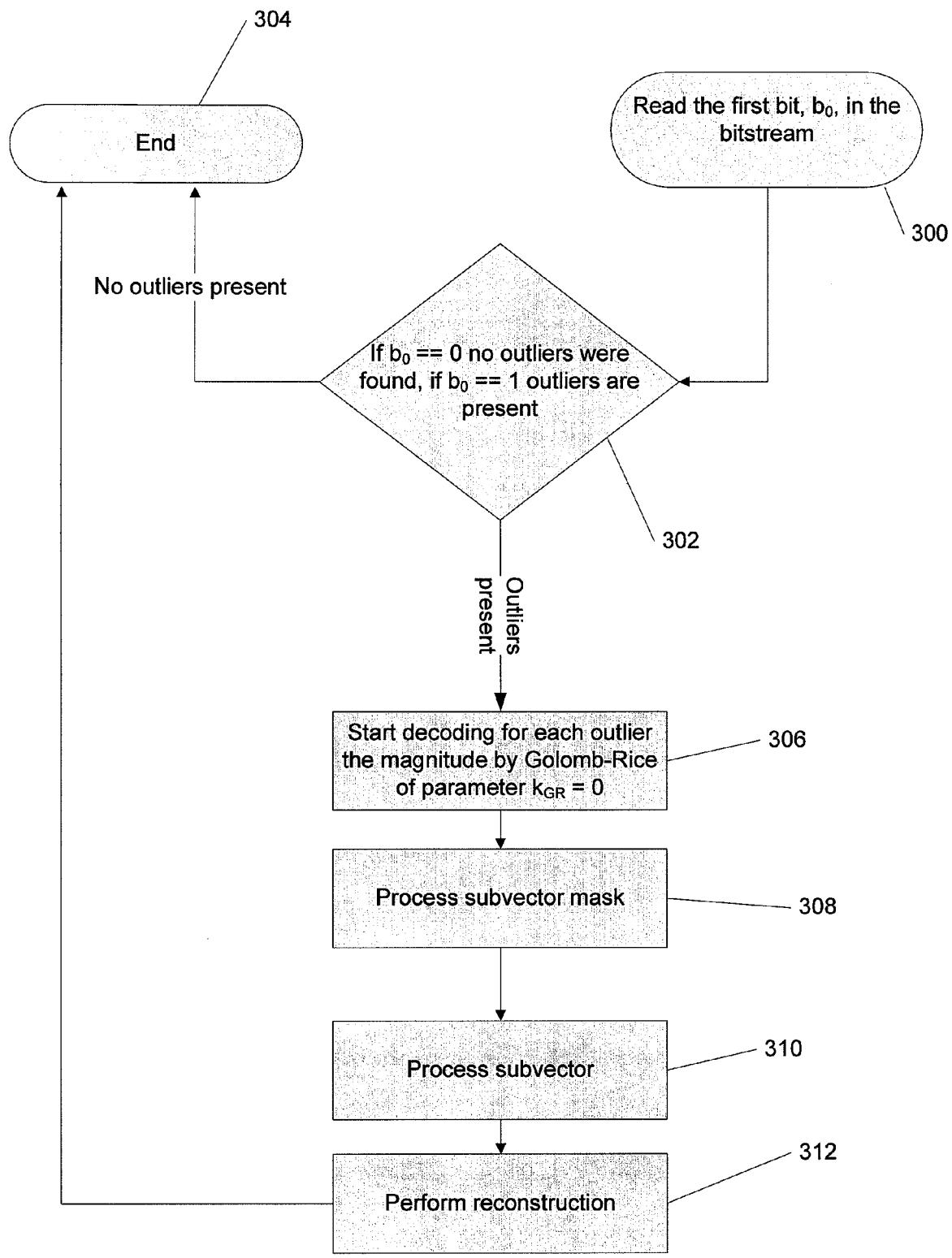
FIG. 3 illustrates a flow chart for an example decoding algorithm.

An example decoding algorithm is shown in FIG. 3. In order to identify possible outliers, in an example embodiment the presence of outliers is indicated by the first bit, $b_0$, in the bitstream, which is read in step 300. In 302, if $b_0=1$, then outliers are present. In the example embodiment, the decoding for each outlier the magnitude by Golomb-Rice of parameter $k_{GR}=0$ then commences 306. Note that all outliers are larger than 1, so the GR code will always start with a 1 (and $b_0$ is part of the first GR code). The number of bits before the first zero bit ($b_0$ included for the first parameter) will give the magnitude of each parameter. The GR codes can be read first and then, if there is a zero (because the GR codes with $k_{GR}=0$ may start with a 1), this means that the magnitudes of the outliers have been read and the number of the outliers can be inferred. Next, the $n_0$ bits of signs of the outliers can be read. Finally, we read with an enumerative code the location of the outliers in the N=280 vector, using $$\left\lceil \log_2 \binom{N}{n_0} \right\rceil$$

bits. Other embodiments may use different approaches for providing the information regarding the number of outliers, amplitudes of the outliers, signs of the outliers, and positions of the outliers.

In an example embodiment, the information about the subvectors, i.e., the subvector mask is processed next 308. At this point, it will be known that there are $n_0$ outliers. The remaining $N-n_0$ unknown samples of the vector can be split into $$n_b = \left\lfloor \frac{N-n_0}{L} \right\rfloor$$

subvectors with length L, denoted for simplicity $x^{[i]}$; i= 1, ..., $n_b$. The value of L may be provided as part of the bit stream, the value can be communicated to the decoder separately from the bit stream, or the value can be known from the context. Furthermore, note a special case of $L>(N-n_0)/2$ implying a case with only one subvector. The remaining $N-n_0-Ln_b$ of samples can be reconstructed using pre-defined values, for example with zero values. Alternatively, other suitable values can be used. Next, the $n_b$ bits $\{t_1, \ldots, t_{nb}\}$ specifying the mask of nontrivial subvectors can be read. The bit $t_i$ tells if the segment $x^{[i]}$ is skipped or encoded. If $t_i=0$ the i-th segment is skipped, and the corresponding subvector is reconstructed using a pre-defined pattern. If $t_i=1$ the segment is coded by the binary codebook. There are $k=\Sigma t_i$ segments encoded by the binary code, the rest of the segments— i.e., the trivial subvectors—may be reconstructed using a pre-defined sample values, for example as samples with zero values. In other embodiments, the subvectors may not be of equal length. In some embodiments the lengths of the subvectors may vary from frame to frame. In yet another embodiment, a different approach for encoding the information on the trivial and non-trivial subvectors may be used, for example, by specifying a variable length code to enumerate different combinations of trivial and non-trivial subvectors.

A non-trivial subvector according to an example embodiment is processed next 310. The non-trivial subvectors of subvectors $x^{[i]}$; i=1, $n_b$ which were encoded by the binary code, are taken in turn. First $a_i$, the $n_a$-bit address in the codebook indicating the selected codeword is read, and the code $c_i$ corresponding to the index $a_i$, found from the codebook. Next, the Hamming weight of the code $c_i$ (i.e., the number of ones in the binary code) is computed and $d_H(c_i)$ bits of sign information is read. With the signs and $c_i$ the three-level non-trivial subvectors $q^{[i]}$; i=1, ..., $n_b$ can be constructed.

At this point 312, the full vectors q can be reconstructed by combining the outlier information (position, magnitude and sign) and the ternary vectors $q^{[i]}$; i=1, ..., $n_b$, and the reconstruction $\hat{z}=gq$ can be obtained, in which g corresponds to the gain, which may be also received as part of the bit stream.

Figure 4:
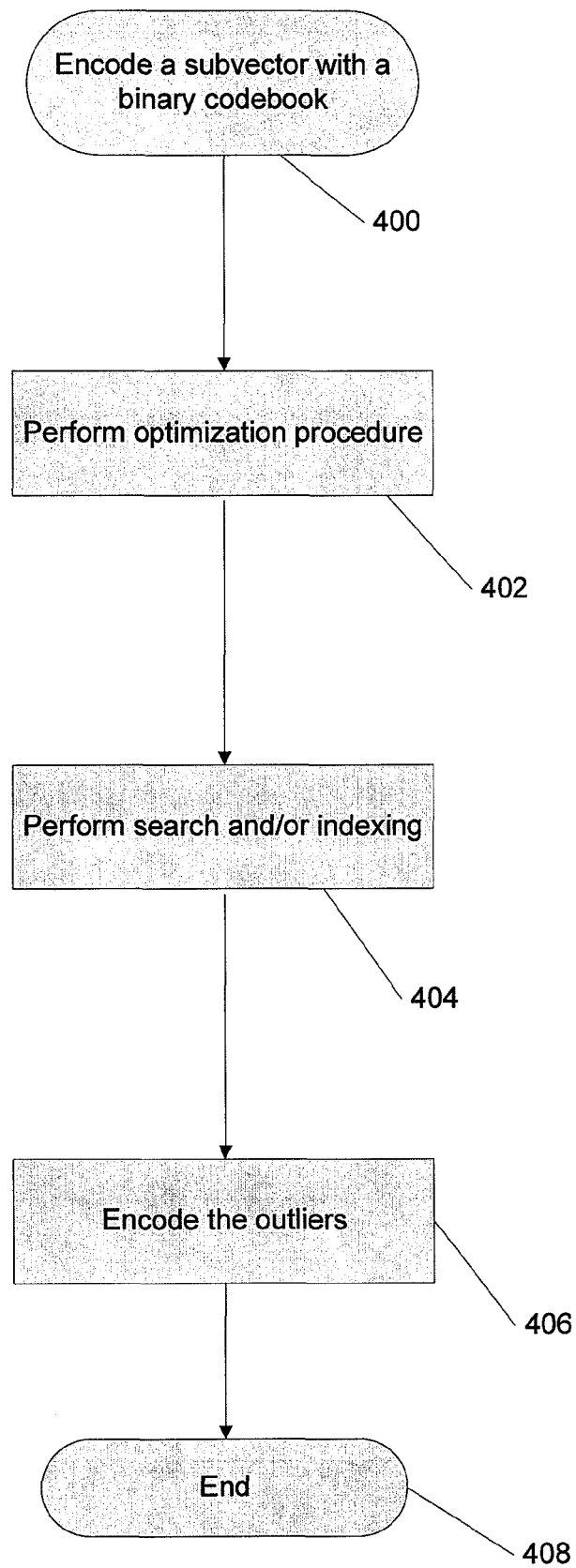
FIG. 4 illustrates a flow chart for an example encoding methodology.

An example encoding methodology is shown in FIG. 4. Optionally, the steps of gain estimation and gain scaling may first be performed, and then detection of one or more outliers in the input vector may proceed 400. Alternatively, one or more outliers in the input vector are detected 400 initially.

Next, an optimization procedure 402 may be performed. The optimization procedure may also include performing a search, such as described in an example embodiment below. Next, one or more outliers may be encoded 404. One or more subvectors may also be encoded 406. Indexing may also be performed as part of the encoding of subvectors. Details of these encoding steps according to an example embodiment are described herein.

As an example, the i-th subvector may be referenced as $z^{[i]}$, but the in the following description the superindex is dropped when there is no need of specifying the index. Given the signed data in a subvector $z=[z_1, \ldots, z_L]=[j_1 y_1, \ldots, j_L y_L]$ of L samples, where $j_i$ is the sign and $y_i$ the absolute value of the sample $z_i$, the reconstructed output will be $\hat{z}=g[j_1 c_1, \ldots, j_L c_L]$, where g is the gain and $c=[c_1, \ldots, c_L] \in C$ is a binary code. The Hamming weight of the code c is $d_H(c)=c^T c \in D_H$. For example, there are eight values of the Hamming weight for all the 4096 $g_{23}$ codes, namely $D_H=\{0, 7, 8, 11, 12, 15, 16, 23\}$. However, it is not necessary to use the codevector with $d_H=0$ in all embodiments, since it may be more efficiently specified by providing explicit information about the trivial subvectors consisting of samples with pre-defined values, for example of zero samples only. An example of such a mechanism is the usage of a subvector mask, where one bit $t_i$ for each subvector is used whether the corresponding subvector is a trivial one (i.e., consisting of samples with pre-defined values) or a non-trivial one. The bit-rate of the subvector z may be a function of the code c through its Hamming weight $d=d_H(c)$. It can comprise the $n_a=12$ bits (for $g_{23}$ and $g_{24}$, $n_a=12=\log_2 4096$) for the address in the codebook and $d_H(c)$ bits for encoding the signs, resulting in the rate:

$$r_d(d) = \begin{cases} n_a + d & \text{if } d > 0 \\ 0 & \text{if } d = 0 \end{cases}$$

$R_d$ can be defined as the set of all $r_d$ where, for example, for $g_{23}$, we have $R_d=\{0, 19, 20, 23, 24, 27, 28, 35\}$, from which 0 can be omitted since it encodes a trivial subvector, which may be encoded as a separate entity. The distortion for the subvector is a function of the code c and the gain g and can be evaluated as $$D(z, c, g) = \sum_i (z_i - \hat{z}_i)^2$$
$$= \sum_{i|c_i=1} (y_i - g)^2 + \sum_{i|c_i=0} y_i^2$$
$$= \sum_i y_i^2 - 2g \sum_{i|c_i=1} y_i + g^2 d_H(c)$$

The second term in the last equation may be maximized. The largest $d_H(c)$ entries of the vector y may be quantized to $c_i=1$ and the rest may be quantized to $c_i=0$. Thus, for a given $d_H$, the optimum code c may be the one maximizing $\sum_{i|c_i=1} y_i$, and may not depend on the gain.

For a given $d \in D_H$ let $c^*(y; d)$ be the maximizing code $$c^*(y, d) = \arg \min_{c|d_H(c)=d} \sum_{i|c_i=1} y_i$$

which is the nearest neighbor of the vector y in the shell of Hamming weight d from the binary codebook.

Thus, for each sub-vector $z^{[i]}$, the improved performance may be described by a set of $|D_H|$ optimum rate-distortion points $(R_d, D_d) = (R(c^*(y, d)), D(z, c^*(y, d), g))$, $d \in D_H$. (Note, $|D_H|$ is the cardinality of set $D_H$). The task of finding the best quantization of the overall vector can result in a typical rate-distortion optimization problem. The goal of the optimization problem is to find for all subvectors $z^{[1]}, \ldots, z^{[nb]}$ the optimal Hamming weights $d^{[1]}, \ldots, d^{[nb]}$, the optimal codes $c^{[1]}, \ldots, c^{[nb]} \in C$, and the gain g* such that $$\min \sum_{i=1}^{n_b} D(z^{[i]}, c^{[i]}, g^*) \text{ s.t. } \sum_{i=1}^{n_b} r_d(d^{[i]}) \leq R$$

Optimization may also be performed. In this optimization, the distortion can be further written as $$\sum_{i=1}^{n_b} D(z^{[i]}, c^{[i]}, g^*) = \sum_{i=1}^{n_b} \left( \sum_j (y_j^{[i]})^2 - 2g \sum_{j|c_j^{[i]}=1} y_j^{[i]} + g^2 d_H(c^{[i]}) \right)$$

Simplifying notations can be used to emphasize the data in the optimization procedure. A first quantity is $s_{ij}$, the scalar product between the subvector $y^{[i]}$ and its nearest neighbor code on the $j^{th}$ shell, which formally can be written $s_{ij} = y^{[i]T} c^*(y^{[i]}, d_j)$. The unknown allocation can be specified by the variables $w_{ij}$, $i=1, \ldots, n_b$; $j=1, \ldots, n_D$, where $w_{ij}=1$ if the subvector $y^{[j]}$ is quantized by its nearest neighbor code on the $j^{th}$ shell, but otherwise $w_{ij}=0$. The variable $n_D$ is the cardinality of the set $D_H$ considered without the value zero. The criterion can now be stated as $$\min_{g,w} \left( -2g \sum_{i=1}^{n_b} \sum_{j=1}^{n_D} s_{ij} w_{ij} + g^2 \sum_{i=1}^{n_b} \sum_{j=1}^{n_D} w_{ij} d_j \right) \text{ s.t. } \sum_{i=1}^{n_b} \sum_{j=1}^{n_D} w_{ij} r_d(d_j) = R$$

The minimization with respect to g for any fixed matrix w leads $$\text{to } g^* = \frac{\sum_{i=1}^{n_b} \sum_{j=1}^{n_D} s_{ij} w_{ij}}{\sum_{i=1}^{n_b} \sum_{j=1}^{n_D} w_{ij} d_j}$$

and the problem can be transformed into $$\max_w \frac{\left( \sum_{i=1}^{n_b} \sum_{j=1}^{n_D} s_{ij} w_{ij} \right)^2}{\sum_{i=1}^{n_b} \sum_{j=1}^{n_D} w_{ij} d_j} \text{ s.t. } \sum_{i=1}^{n_b} \sum_{j=1}^{n_D} w_{ij} r_d(d_j) = R.$$

We observe that $$\sum_{i=1}^{n_b}\sum_{j=1}^{n_D} w_{ij}d_j = \sum_{i=1}^{n_b}\sum_{j=1}^{n_D} w_{ij}r_d(d_j) - k_b n_a = R - k_b n_a$$

where $k_b$ is the number of nontrivially quantized subvectors and thus the criterion to be maximized is $$\max_w \frac{1}{R - k_b n_a}\left(\sum_{i=1}^{n_b}\sum_{j=1}^{n_D} s_{ij}w_{ij}\right)^2.$$

The possible values of $k_b$ can be bracketed as $\lfloor(B-n_b)/(n_a+d_1)\rfloor \geq k_b \geq \lfloor(B-n_b)/(n_a+d_{n_D})\rfloor$ (e.g. for B=144, $n_b$=12, and $g_{23}$ codes the bounds are $6 \geq k_b \geq 3$). For each $k_b$ we may solve an LP problem. Alternatively one can evaluate the criterion in $$\max_w \frac{1}{R - k_b n_a}\left(\sum_{i=1}^{n_b}\sum_{j=1}^{n_D} s_{ij}w_{ij}\right)^2$$

by a trellis approach.

An example embodiment may comprise an approach that is faster than solving the LP problem or using the trellis approach. The faster approach is described next. One can generate iteratively all possible combinations $$d_{i_1} \geq d_{i_2} \geq \ldots \geq d_{i_{k_b}}$$

such that $\Sigma_{i=j}^{k_b} r_d(d_{ij}) = R$. For example when R=132 and for $g_{23}$, there are 26 such tuples, starting with (23, 23, 23, 23, 20, 20), where $k_b$=6, and ending with (35, 35, 35, 27), where $k_b$=4. For each such tuple, say $$V = (d_{i_1}, d_{i_2}, \ldots, d_{i_{k_b}})$$

first check which are the optimizing arguments l*, $i_j$*=arg $\max_{l,i_j}\{s(l,i_j):l=1,\ldots,n_b,i_j\in\{i_1,\ldots,i_{k_b}\}\}$, and allocate to the subvector l* the closest code from the $i_j$*-th shell. Remove now the subvector l* from the list of subvectors and $d_{i_j}$* from the tuple V and continue the process. Although not globally optimal, the procedure provides very quick and close to optimal solutions.

In one embodiment, a fast search and indexing may also be performed. For finding the closest neighbor for each of the shells (of various Hamming weights) of the Golay codebook, the connection between the hexacode and the Golay codes can be used.

In this embodiment, fast evaluations are modified with the addition that evaluation is performed for all hexacode codewords not only for the preferable interpretation, but also for some or all possible interpretations. Track can be kept for each interpretation the Hamming weight of the corresponding Golay codeword. In the end, a search can be performed in order to identify, for each Hamming weight, what is the maximum dot product. Compared to a direct full dictionary search this methodology may accelerate the time of search by a factor of three to four, and avoids the storing of the full 4096 vectors of the Golay codebook. Instead, only the 64 codewords of the hexacode need to be stored. The index of the winning codewords for each shell can be obtained from the six bit index in the hexacode codebook, and additionally 6 bits, one for specifying the preference for the interpretation of each of the six GF(4) (i.e., GF($2^m$) is a Galois field with $2^m$ elements) symbols of the hexacode codeword. The decoder preferably also has the hexacode codebook, and it can perform reconstruction with the binary Golay codeword by retrieving from the hexacode codebook the hexacode codeword and using then the interpretation bits to transcribe into 0 and 1 the GF(4) symbols. This makes decoding extremely fast.

The number $n_O$ of outlying values may be determined by statistical modeling. A threshold of 3 times the estimated gain (estimated over the full vector) may be employed to declare a sample of the input vector as an outlier. However, any threshold or different criteria can be used. Because encoding for each outlier its position, amplitude, and sign may be very expensive in terms of usage of bits, the number outliers may be limited. In an example embodiment, the value of the number of outliers in a vector was limited to $n_O$=4. However, other embodiments may use any limit for the maximum number of outliers, including fixed and adaptive limits. Outliers may be encoded as described above.

The address in the Golay codebooks (both for $g_{23}$ and $g_{24}$) can be specified alternatively by the following 12 bits: first the 6-bit address of the corresponding hexacode codeword in the 64 long hexacode codebook; and next by 6 bits, each specifying what of the two possibilities is the preferred interpretation of the GF(4) symbol.

It should be noted that the foregoing has been tested within the frame work of superwideband extension of the wideband speech codec G.718 (known also as EV-VBR) recently standardized in ITU Q9. The wideband codec is an embedded scalable codec with bitrates of 8, 12, 16, 24, and 32 kbits/s. The superwideband extension adds supplementary layers by encoding the higher frequencies (7-14 kHz). For some of the samples (especially music) the quality of the superwideband coded version is saturated by the quality of the lower frequencies (0-7 kHz). Therefore, in addition to information relative to higher frequencies, the extension can provide a refinement of the lower frequencies as well. There is a 8 kbits/s layer allocated to the refinement of the lower frequencies. For frame length of 20 ms it corresponds to 160 bits per frame. There are 9 bits reserved, leaving 151 bits for quantization. For a sampling frequency of 32 kHz, the spectral data up to 7 kHz is expressed by means of 280 coefficients, making an overall bitrate of 151/280=0.54 bits per sample. At such a low rate, it is customary to use the gain shape approach and if 7 bits are used for a global gain there are 144 bits left for the quantization of the shape.

Two datasets consisting of mixed speech and audio content were used in the tests. Each vector of length 280 was quantized using the binary codes $g_{23}$ and $g_{24}$. The two variants of the proposed methodologies were compared to the quantization based on the Voronoi extension of the rotated lattice $E_8$ (i.e., RE8 is the rotated lattice $E_8$) presented in $$\sum_{i=1}^{n_b} D(z^{[i]}, c^{[i]}, g^*) = \sum_{i=1}^{n_b}\left(\sum_j (y_j^{[i]})^2 - 2g\sum_{j|c_j^{[i]}=1} y_j^{[i]} + g^2 d_H(c^{[i]})\right).$$

The best results are obtained when using the binary codes $g_{23}$, surpassing by 0.2 dB the results of the Voronoi extension using the lattice RE8. The results of the new methodology using the binary codes $G_{24}$ are still very good, but not as good as for the $G_{23}$. There are two main explanations of the results. For the codes $G_{24}$ the difference between the vector length and a multiple of 24 (i.e. 11×24=264) is quite large. In order not to complicate the algorithm, the last 16 samples of the full vector may be set to 0. Other techniques are within the spirit and scope of the present invention such as, for example, finding the optimal position of a segment of 16 samples to be deleted and transmitting its position. In this example, discarding the last 16 samples was chosen, though some of the frames have quite a high activity in those regions. For the codes $G_{23}$, the last incomplete vector is very small (it has just 4 samples), and thus there is no problem. Second, the flexibility offered by the 8 shells of the $G_{23}$ allows a versatile rate-distortion optimization, while the codes $G_{24}$ have only 5 nontrivial shells, offering fewer combinations to choose from.

An average of segmental signal to noise ratio (SNR) for different quantization methods is reproduced in the table below.

| Dataset | RE8 | Proposed method with $G_{23}$ | Proposed method with $G_{24}$ |
|---|---|---|---|
| Set 1 | 2.383 | 2.594 | 2.424 |
| Set 2 | 2.377 | 2.615 | 2.426 |

Standard deviation of segmental SNR for different quantization methods is shown in the following table.

| Dataset | RE8 | New using $G_{23}$ | New using $G_{24}$ |
|---|---|---|---|
| Test 1 | 0.424 | 0.399 | 0.374 |
| Test 2 | 0.297 | 0.215 | 0.209 |

In other embodiments, the above-described decoding and encoding algorithms, functionality, steps, and methodology can be implemented in a terminal such as shown as 105, 110, 115, 120 or 212.

In additional embodiments, the above-described decoding and encoding algorithms, functionality, steps, and methodology can be implemented as computer-executable instructions stored on computer-readable media. In FIGS. 1-2, processors for executing the computer-executable instructions are shown as 155 and 228. Computer-executable instructions are shown as software 165 and 240, which is stored on computer-readable media such as 160 and 234.

What has been described above is merely illustrative of various aspects and embodiments of the present invention. Indeed, the present invention is not limited to devices and methods of providing high-quality audio coding at low bitrates. For example, the same principles could be applied to coding of any data that does not require perfect reconstruction, such as image or video coding. Those skilled in the art can implement other devices, systems, configurations, arrangements, methods, and signal processing techniques without departing from the spirit and scope of the invention. Further, any of the methods of the invention can be implemented in software that can be stored on computer disks or other computer-readable media.

EXAMPLE EMBODIMENTS

The following are example embodiments in accordance with various aspects of the invention.

A method comprising:
splitting an input signal into an outlier portion and a stationary portion;
encoding the outlier portion of the input signal;
dividing the stationary portion into one or more subvectors;
classifying each of said subvectors as trivial or non-trivial;
encoding each said trivial subvector using a pre-defined pattern; and
encoding each said non-trivial subvector with at least one location of at least one significant sample and a sign of said at least one significant sample.

A method comprising:
splitting an input signal into an outlier portion and a stationary portion;
encoding amplitudes, signs, and positions of the outlier portion of the input signal;
dividing the stationary portion into subvectors of equal length;
classifying each of said subvectors as trivial or non-trivial;
encoding each said trivial subvector using a pre-defined pattern; and
encoding each said non-trivial subvector with at least one location of a significant sample and a sign of the significant sample.

A method comprising:
splitting an input signal into an outlier portion and a stationary portion;
encoding amplitudes, signs, and positions of the outlier portion of the input signal;
dividing the stationary portion into subvectors of equal length;
classifying each of said subvectors as trivial or non-trivial;
encoding each said trivial subvector using a pre-defined pattern; and
encoding each said non-trivial subvector with at least one location of a significant sample and a sign of the significant sample, said location of the significant sample within the non-trivial subvector is encoded using a nearest neighbor in a selected portion of binary code.

A method comprising:
splitting an input signal into an outlier portion and a stationary portion;
encoding amplitudes of outliers using Golomb-Rice codes;
encoding signs and positions of the outlier portion of the input signal;
dividing the stationary portion into subvectors of equal length;
classifying each of said subvectors as trivial or non-trivial;
encoding each said trivial subvector using a pre-defined pattern; and
encoding each said non-trivial subvector with at least one location of a significant sample and a sign of the significant sample, said location of the significant sample within the non-trivial subvector is encoded using a nearest neighbor in a selected portion of binary code.

A method comprising:
determining whether at least one outlier is present;
decoding said at least one outlier by retrieving information relative to magnitude, sign, and position of the outlier;
processing information about one or more subvectors;
processing encoded data for at least one subvector in order to identify information including said position, said magnitude, and said sign; and
using the information in order to perform reconstruction.

A method comprising:
identifying a Golay codeword;
identifying a Hamming weight for said Golay codeword; and
identifying a maximum dot product in relation with an input vector for each said Hamming weight.

A method comprising:
a plurality of interpretations for each hexacode codeword;
identifying a Hamming weight for each said interpretation of the hexacode codeword; and
identifying a maximum dot product in relation with an input vector for each said Hamming weight.

A method comprising:
encoding a vector with at least one location of a significant sample and a sign of the significant sample, said location of the significant sample within the vector is encoded using a nearest neighbor in a selected portion of binary code.

A computer-readable medium that contains computer readable instructions that cause a computer device to perform the steps comprising:
  splitting an input signal into an outlier portion and a stationary portion;
  encoding the outlier portion of the input signal;
  dividing the stationary portion into subvectors;
  classifying each of said subvectors as trivial or non-trivial;
  encoding each said trivial subvector using a pre-defined pattern; and
  encoding each said non-trivial subvector with at least one location of at least one significant sample and a sign of said at least one significant sample.

A computer-readable medium that contains computer readable instructions that cause a computer device to perform the steps comprising:
  splitting an input signal into an outlier portion and a stationary portion;
  encoding amplitudes, signs, and positions of the outlier portion of the input signal;
  dividing the stationary portion into subvectors of equal length;
  classifying each of said subvectors as trivial or non-trivial;
  encoding each said trivial subvector using a pre-defined pattern; and
  encoding each said non-trivial subvector with at least one location of a significant sample and a sign of the significant sample.

A computer-readable medium that contains computer readable instructions that cause a computer device to perform the steps comprising:
  splitting an input signal into an outlier portion and a stationary portion;
  encoding amplitudes, signs, and positions of the outlier portion of the input signal;
  dividing the stationary portion into subvectors of equal length;
  classifying each of said subvectors as trivial or non-trivial;
  encoding each said trivial subvector using a pre-defined pattern; and
  encoding each said non-trivial subvector with at least one location of a significant sample and a sign of the significant sample, said location of the significant sample within the non-trivial subvector is encoded using a nearest neighbor in a selected portion of binary code.

A computer-readable medium that contains computer readable instructions that cause a computer device to perform the steps comprising:
  splitting an input signal into an outlier portion and a stationary portion;
  encoding amplitudes using Golomb-Rice codes of the outlier portion of the input signal;
  encoding signs and positions of the outlier portion of the input signal;
  dividing the stationary portion into subvectors of equal length;
  classifying each of said subvectors as trivial or non-trivial;
  encoding each said trivial subvector using a pre-defined pattern; and
  encoding each said non-trivial subvector with at least one location of a significant sample and a sign of the significant sample, said location of the significant sample within the non-trivial subvector is encoded using a nearest neighbor in a selected portion of binary code.

A computer-readable medium that contains computer readable instructions that cause a computer device to perform the steps comprising:
  splitting an input signal into an outlier portion and a stationary portion;
  encoding amplitudes using Golomb-Rice codes of the input signal;
  encoding signs and positions of the outlier portion of the input signal;
  dividing the stationary portion into subvectors of equal length;
  classifying each of said subvectors as trivial or non-trivial;
  encoding each said trivial subvector using a pre-defined pattern; and
  encoding each said non-trivial subvector with at least one location of a significant sample and a sign of the significant sample, said location of the significant sample within the non-trivial subvector is encoded using a nearest neighbor in a selected portion of binary code.

A computer-readable medium that contains computer readable instructions that cause a computer device to perform the steps comprising:
  determining whether at least one outlier is present;
  decoding said at least one outlier by retrieving information relative to magnitude, sign, and position of the outlier;
  processing information about one or more subvectors;
  processing encoded data for at least one subvector in order to identify information including said position, said magnitude, and said sign; and
  using the information in order to perform reconstruction.

A computer-readable medium that contains computer readable instructions that cause a computer device to perform the steps comprising:
  identifying a Golay codeword;
  identifying a Hamming weight for said Golay codeword; and
  identifying a maximum dot product in relation with an input vector for each said Hamming weight.

A computer-readable medium that contains computer readable instructions that cause a computer device to perform the steps comprising:
  identifying a plurality of interpretations for each hexacode codeword;
  identifying a Hamming weight for each said interpretation of the hexacode codeword; and
  identifying a maximum dot product in relation with an input vector for each said Hamming weight.

A computer-readable medium that contains computer readable instructions that cause a computer device to perform the steps comprising:

encoding a vector with at least one location of a significant sample and a sign of the significant sample, said location of the significant sample within the vector is encoded using a nearest neighbor in a selected portion of binary code.

An apparatus comprising:
a processor for executing computer executable instructions;
memory that stores the computer executable instructions;
means for receiving an input signal;
wherein the computer executable instructions cause the apparatus to:
split an input signal into an outlier portion and a stationary portion;
encode amplitudes, signs, and positions of the outlier portion of the input signal;
divide the stationary portion into subvectors of equal length;
classify each of said subvectors as trivial or non-trivial;
encode each said trivial subvector using a pre-defined pattern; and
encode each said non-trivial subvector with at least one location of at least one significant sample and a sign of said at least one significant sample.

An apparatus comprising:
a processor for executing computer executable instructions;
memory that stores the computer executable instructions;
means for receiving an input signal;
wherein the computer executable instructions cause the apparatus:
split an input signal into an outlier portion and a stationary portion;
encode the outlier portion of the input signal;
divide the stationary portion into subvectors;
classify each of said subvectors as trivial or non-trivial;
encode each said trivial subvector using a pre-defined pattern; and
encode each said non-trivial subvector with at least one location of a significant sample and a sign of the significant sample.

An apparatus comprising:
a processor for executing computer executable instructions;
memory that stores the computer executable instructions;
means for receiving an input signal;
wherein the computer executable instructions cause the apparatus to:
split an input signal into an outlier portion and a stationary portion;
encode amplitudes, signs, and positions of the outlier portion of the input signal;
divide the stationary portion into subvectors of equal length;
classify each of said subvectors as trivial or non-trivial;
encode each said trivial subvector using a pre-defined pattern; and
encode each said non-trivial subvector with at least one location of a significant sample and a sign of the significant sample.

An apparatus comprising:
a processor for executing computer executable instructions;
memory that stores the computer executable instructions;
means for receiving an input signal;
wherein the computer executable instructions cause the apparatus to:

split an input signal into an outlier portion and a stationary portion;
encode amplitudes, signs, and positions of the outlier portion of the input signal;
divide the stationary portion into subvectors of equal length;
classify each of said subvectors as trivial or non-trivial;
encode each said trivial subvector using a pre-defined pattern; and
encode each said non-trivial subvector with at least one location of a significant sample and a sign of the significant sample, said location of the significant sample within the non-trivial subvector is encoded using a nearest neighbor in a selected portion of binary code.

An apparatus comprising:
a processor for executing computer executable instructions;
memory that stores the computer executable instructions;
means for receiving an input signal;
wherein the computer executable instructions cause the apparatus to:
split an input signal into an outlier portion and a stationary portion;
encode amplitudes using Golomb-Rice codes of the outlier portion of the input signal;
encode signs and positions of the outlier portion of the input signal;
divide the stationary portion into subvectors of equal length;
classify each of said subvectors as trivial or non-trivial;
encode each said trivial subvector using a pre-defined pattern; and
encode each said non-trivial subvector with at least one location of a significant sample and a sign of the significant sample, said location of the significant sample within the non-trivial subvector is encoded using a nearest neighbor in a selected portion of binary code.

An apparatus comprising:
a processor for executing computer executable instructions;
memory that stores the computer executable instructions;
means for receiving an input signal;
wherein the computer executable instructions cause the apparatus to:
split an input signal into an outlier portion and a stationary portion;
encode amplitudes using Golomb-Rice codes of the input signal;
encode signs and positions of the outlier portion of the input signal;
divide the stationary portion into subvectors of equal length;
classify each of said subvectors as trivial or non-trivial;
encode each said trivial subvector using a pre-defined pattern; and
encode each said non-trivial subvector with at least one location of a significant sample and a sign of the significant sample, said location of the significant sample within the non-trivial subvector is encoded using a nearest neighbor in a selected portion of binary code.

An apparatus comprising:
a processor for executing computer executable instructions;
memory that stores the computer executable instructions;

means for receiving an input signal;
wherein the computer executable instructions cause the apparatus to:
  determine whether at least one outlier is present;
  decode said at least one outlier by retrieving information relative to magnitude, sign, and position of the outlier;
  process information about one or more subvectors;
  process encoded data for at least one subvector in order to identify information including said position, said magnitude, and said sign; and
  use the information in order to perform reconstruction.

An apparatus comprising:
a processor for executing computer executable instructions;
memory that stores the computer executable instructions;
wherein the computer executable instructions cause the apparatus to:
  identify a Golay codeword;
  identify a Hamming weight for said Golay codeword; and
  identify identifying a maximum dot product in relation with an input vector for each said Hamming weight.

An apparatus comprising:
a processor for executing computer executable instructions;
memory that stores the computer executable instructions;
wherein the computer executable instructions cause the apparatus to:
  identify a plurality of interpretations for each hexacode codeword;
  identify a Hamming weight for each said interpretation of the hexacode codeword; and
  identify a maximum dot product in relation with an input vector for each said Hamming weight.

An apparatus comprising:
a processor for executing computer executable instructions;
memory that stores the computer executable instructions;
wherein the computer executable instructions cause the apparatus to:
  encode a vector with at least one location of a significant sample and a sign of the significant sample, said location of the significant sample within the vector is encoded using a nearest neighbor in a selected portion of binary code.

We claim:

1. A method comprising:
splitting, at an apparatus, an input vector into an outlier portion and a stationary portion;
encoding the outlier portion of the input vector;
dividing the stationary portion into one or more subvectors;
classifying each of said subvectors as trivial or non-trivial;
encoding each said trivial subvector using pre-defined sample values; and
encoding each said non-trivial subvector with at least one location of at least one significant sample and a sign of said at least one significant sample.

2. The method of claim 1 wherein the steps of the method are implemented as computer-executable instructions stored on a computer readable medium.

3. The method of claim 1 wherein the encoding of the outlier portion comprises encoding amplitudes, signs and positions of samples of the outlier portion.

4. The method of claim 3 wherein the encoding of the amplitudes of the samples of the outlier portion comprises using a Golomb-Rice code.

5. A method comprising:
determining whether at least one outlier sample is present within a data vector;
decoding, at an apparatus, said at least one outlier sample by retrieving information relative to magnitude, sign, and position of the outlier sample;
processing information about one or more subvectors within the data vector;
processing encoded data for at least one subvector at said apparatus in order to identify information including a binary codeword and sign information for said at least one subvector; and
using the information in order to perform reconstruction.

6. The method of claim 5 wherein the steps of the method are implemented as computer-executable instructions stored on a computer readable medium.

7. The method of claim 5 wherein the decoding of said at least one outlier sample comprises using a Golomb-Rice code.

8. The method of claim 5 wherein the processing of the encoded data for said at least one subvector comprises decoding a codeword of a binary Golay code.

9. A method comprising:
encoding, at an apparatus, a vector with at least one location of a significant sample and a sign of the significant sample, said location of the significant sample within the vector is encoded using a nearest neighbor in a selected portion of binary code;
encoding a second vector with at least one location of a significant sample and a sign of a significant sample,
wherein said location of a significant sample within said vector is encoded using a nearest neighbor in a first selected portion of binary code and said location of a significant sample within said second vector is encoded using a nearest neighbor in a second selected portion of binary code, and wherein said first and second locations are jointly encoded to minimize distortion.

10. The method of claim 9 wherein the steps of the method are implemented as computer-executable instructions stored on a computer readable medium.

11. The method of claim 9 wherein said selected portion of a binary code comprises a shell of the binary code having a predetermined Hamming weight.

12. The method of claim 9 wherein the binary code is a binary Golay code.

13. The method of claim 9 wherein said first selected portion of binary code is different from said second selected portion of binary code.

14. An apparatus comprising:
a processor for executing computer executable instructions;
memory that stores the computer executable instructions;
wherein the computer executable instructions cause the apparatus to:
  split an input vector into an outlier portion and a stationary portion;
  encode the outlier portion of the input vector;
  divide the stationary portion into one or more subvectors;
  classify each of said subvectors as trivial or non-trivial;
  encode each said trivial subvector using pre-defined sample values; and
  encode each said non-trivial subvector with at least one location of at least one significant sample and a sign of said at least one significant sample.

15. The apparatus of claim 14 wherein the computer executable instructions cause the apparatus to:
    encode amplitudes, signs and positions of samples of the outlier portion.

16. The apparatus of claim 15 wherein the computer executable instructions cause the apparatus to:
    encode the amplitudes of the samples of the outlier portion using at least a Golomb-Rice code.

17. An apparatus comprising:
    a processor for executing computer executable instructions;
    memory that stores the computer executable instructions;
    wherein the computer executable instructions cause the apparatus to:
        determine whether at least one outlier sample is present within a data vector;
        decode said at least one outlier sample by retrieving information relative to magnitude, sign, and position of the outlier sample;
        process information about one or more subvectors within the data vector;
        process encoded data for at least one subvector in order to identify information including a binary codeword and sign information for said at least one subvector; and
        use the information in order to perform reconstruction.

18. The apparatus of claim 17 wherein the computer executable instructions cause the apparatus to:
    decode a codeword of a binary Golay code when processing the encoded data for said at least one subvector.

19. An apparatus comprising:
    a processor for executing computer executable instructions;
    memory that stores the computer executable instructions;
    wherein the computer executable instructions cause the apparatus to:
        encode a vector with at least one location of a significant sample and a sign of the significant sample, said location of the significant sample within the vector is encoded using a nearest neighbor in a selected portion of binary code;
        encode a second vector with at least one location of a significant sample and a sign of a significant sample,
        wherein said location of a significant sample within said vector is encoded using a nearest neighbor in a first selected portion of binary code and said location of a significant sample within said second vector is encoded using a nearest neighbor in a second selected portion of binary code, and wherein said first and second locations are jointly encoded to minimize distortion.

* * * * *